United States Patent [19]
Sukegawa et al.

[11] Patent Number: 5,387,485
[45] Date of Patent: Feb. 7, 1995

[54] PHASE SHIFT PHOTOMASK

[75] Inventors: Makoto Sukegawa; Naoya Hayashi, both of Tokyo, Japan

[73] Assignee: Dai Nippon Printing Co., Ltd., Tokyo, Japan

[21] Appl. No.: 158,210

[22] Filed: Nov. 29, 1993

[30] Foreign Application Priority Data

Nov. 27, 1992 [JP] Japan .................. 4-339519

[51] Int. Cl.$^6$ ................................ G03F 9/00
[52] U.S. Cl. ....................... 430/5; 430/311; 430/396
[58] Field of Search ............ 430/5, 311, 396

[56] References Cited

U.S. PATENT DOCUMENTS 5,273,850 12/1993 Lee et al. .................. 430/5

FOREIGN PATENT DOCUMENTS 0492630 1/1992 European Pat. Off. .

Primary Examiner—Steve Rosasco
Attorney, Agent, or Firm—Sughrue, Mion, Zinn, Macpeak & Seas

[57] ABSTRACT

A phase shift photomask for forming a fine-line pattern with high dimensional accuracy even at different focus positions. The phase shift photomask has a transparent substrate (1) of quartz, for example, and a light-shielding film (2) of chromium, for example, provided on the substrate (1). The light-shielding film (2) is partially removed to form a first opening pattern (4a) and a second opening pattern (4b) with a very small width which is annularly provided in a peripheral region adjacent to the first opening pattern (4a). The light-shielding film (2c) is left in each of the four corners of the second opening pattern (4b). In addition, a phase shifter layer 3 is provided over either of the first or second opening patterns (4a, 4b).

3 Claims, 4 Drawing Sheets

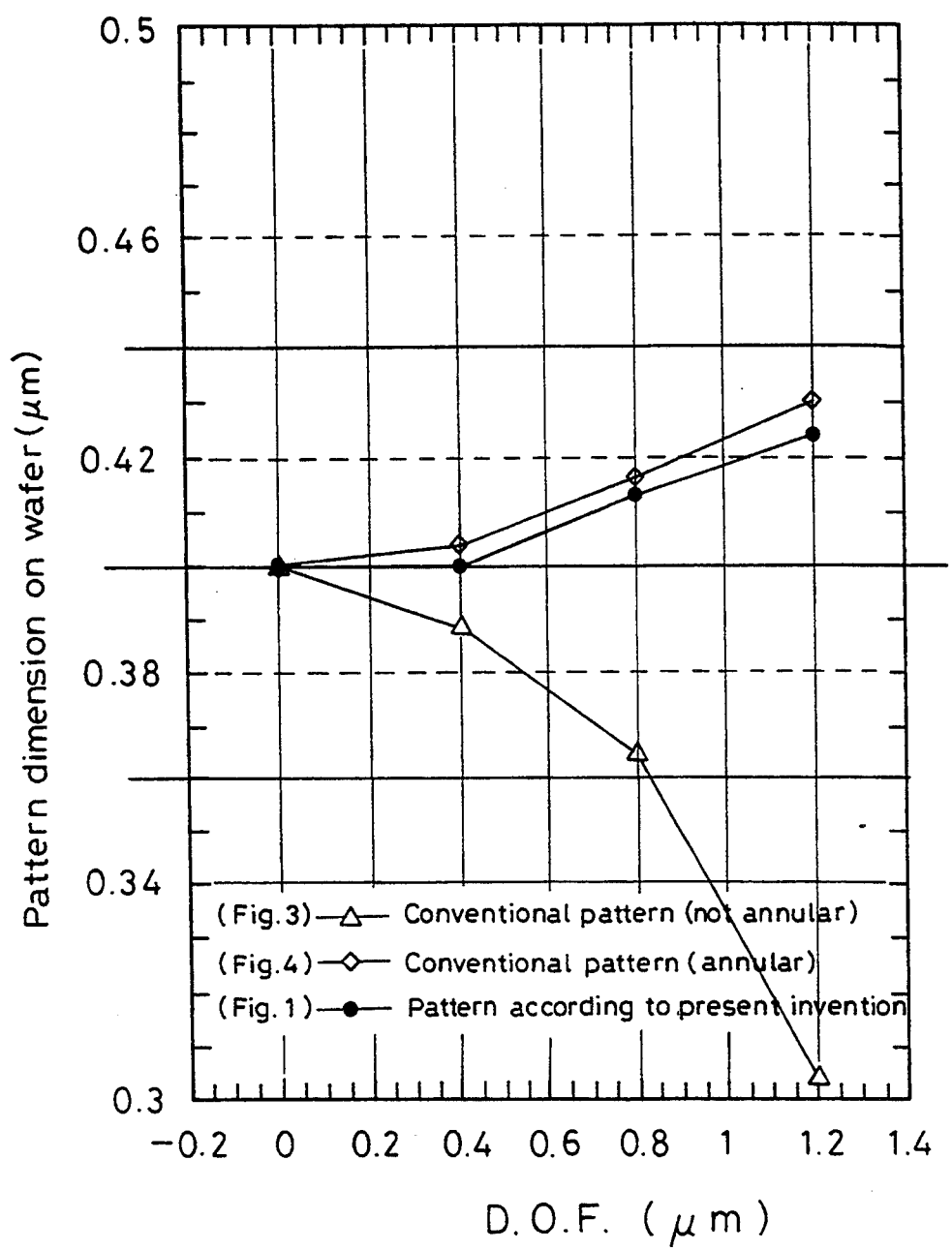

Conventional photomask

Present invention

← Relative light intensity at which pattern dimension on wafer is 0.4μm

PHASE SHIFT PHOTOMASK

BACKGROUND OF THE INVENTION

The present invention relates to a phase shift photomask used as an original drawing for a reduction projection aligner.

Hitherto, formation of fine-line patterns for solid-state devices, e.g., VLSI, has been carried out mainly by a reduction projection exposure method. In this method, light is applied to a photomask, which has a magnified pattern drawn thereon, by using a projection optical system so that a reduced image of the pattern is formed on a substrate coated with a resist by light transmitted through the photomask, thereby transferring the pattern.

As the density of patterns becomes higher, the pattern separation decreases, and it has become close to the wavelength of the light source in recent years, resulting in poor resolution and contrast of the projected image. To improve the resolution and contrast of the projected image, a phase shift photomask has been proposed, and a technique wherein a second opening pattern is provided in a peripheral region adjacent to a first opening pattern to further improve the resolution has been proposed as is disclosed in Japanese Patent Application Laid-Open (KOKAI) No. 62-67514 (1987).

The conventional phase shift photomask suffers, however, from the following problem: In the actual semiconductor manufacturing process, a fine-line pattern must be transferred to the whole area of the wafer surface having steps of 1 μm to 2 μm. With the conventional phase shift photomask, however, when a pattern is simultaneously formed at different focus positions, there is considerable variation in the dimension of the transferred pattern.

SUMMARY OF THE INVENTION

It is an object of the present invention to provide a phase shift photomask for forming a fine-line pattern with high dimensional accuracy even at different focus positions.

The present invention provides a phase shift photomask having a transparent substrate (1) of quartz, for example, and a light-shielding film (2) of chromium, for example, which is provided on the substrate (1). The light-shielding film (2) is partially removed to form a first opening pattern (4a) and a second opening pattern (4b) with a very small width which is annularly provided in a peripheral region adjacent to the first opening pattern (4a). The phase shift photomask further has a phase shifter layer (3) provided over either of the first or second opening patterns (4a, 4b). The light-shielding film (2c) is left in each of the four corners of the second opening pattern (4b) so as to limit light transmitted through the four corners.

In general, the first opening pattern (4a) is square, and the second opening pattern (4b) is formed in a square frame shape in a region adjacent to the first opening pattern (4a). The light-shielding film (2c) in the four corners of the second opening pattern (4b) is provided by leaving the light-shielding film in the outer regions of the four corners of the frame-shaped second opening pattern (4b). The degree of adjacency and line width of the second opening pattern (4b) are not particularly restricted as long as the second opening pattern (4b) does not resolve on the wafer by itself. The light-shielding film (2c) may be left in either an oblique line shape or a curved line shape in each of the four corners.

That is, the second opening pattern (4b), which is provided adjacent to the first opening pattern (4a) so as to surround it, is annularly formed, and the light-shielding film (2c) is left in each of the four corners of the second opening pattern (4b) to prevent the second opening pattern (4b) from resolving and producing an adverse effect on the transferred pattern. In addition, the phase shifter layer (3) is provided over either the first opening pattern (4a) or the second opening pattern (4b) to give a phase difference of 180°.

In the present invention, the second opening pattern (4b), which is provided around the first opening pattern (4a), is annularly formed such that the light-shielding film (2c) is left in each of the four corners thereof, and the phase shifter layer (3) is formed to give a phase difference of 180°. Accordingly, the depth of focus increases without causing resolution of the second opening pattern (4b). Thus, it is possible to transfer a pattern having a substantially uniform dimension irrespective of focus position.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 5 is a graph illustrating the relationship between D.O.F. (Depth Of Focus) and the dimension variation on the wafer surface at the time of transferring a pattern to a wafer by using each of the phase shift photomasks shown in FIGS. 1, 3 and 4.

DESCRIPTION OF THE PREFERRED EMBODIMENTS

The present invention will be described below with reference to the accompanying drawings by comparison with the conventional technique.

Figure 1:
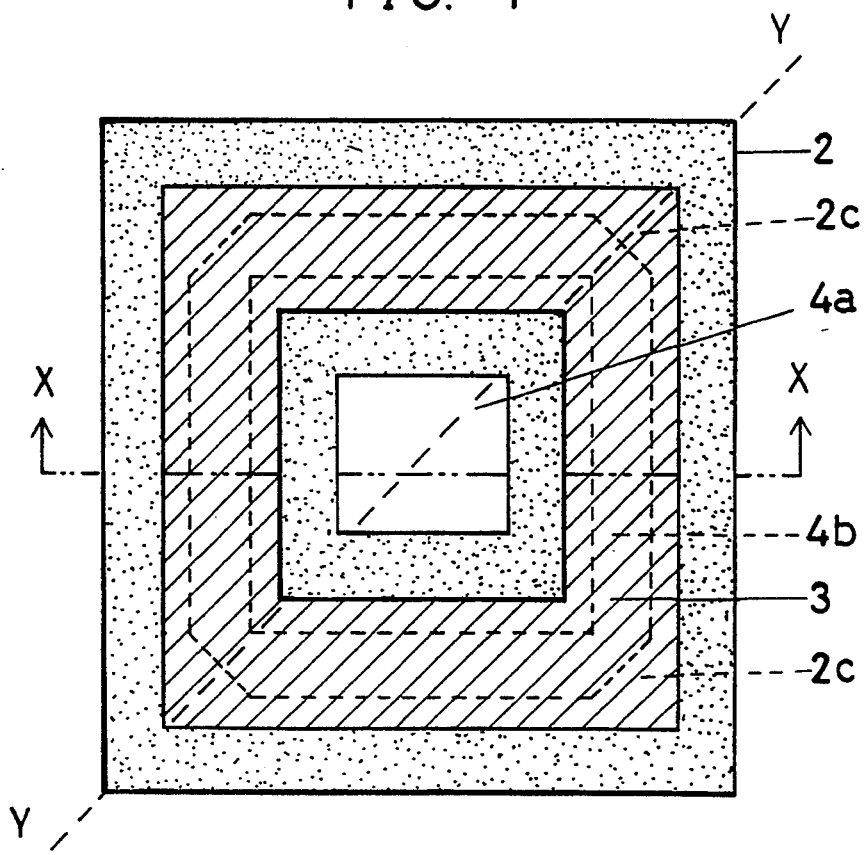
FIG. 1 is a plan view illustrating one embodiment of the phase shift photomask according to the present invention.
Figure 2:
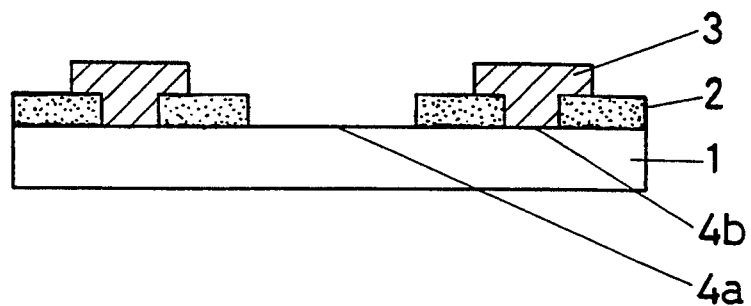
FIG. 2 is a sectional view seen from the arrow X—X in FIGS. 1, 3 and 4.

FIG. 1 is a plan view illustrating one embodiment of the phase shift photomask according to the present invention. FIG. 2 is a sectional view seen from the arrow X—X in FIG. 1, also showing a section seen from the arrow X—X in each of FIGS. 3 and 4.

Figure 3:
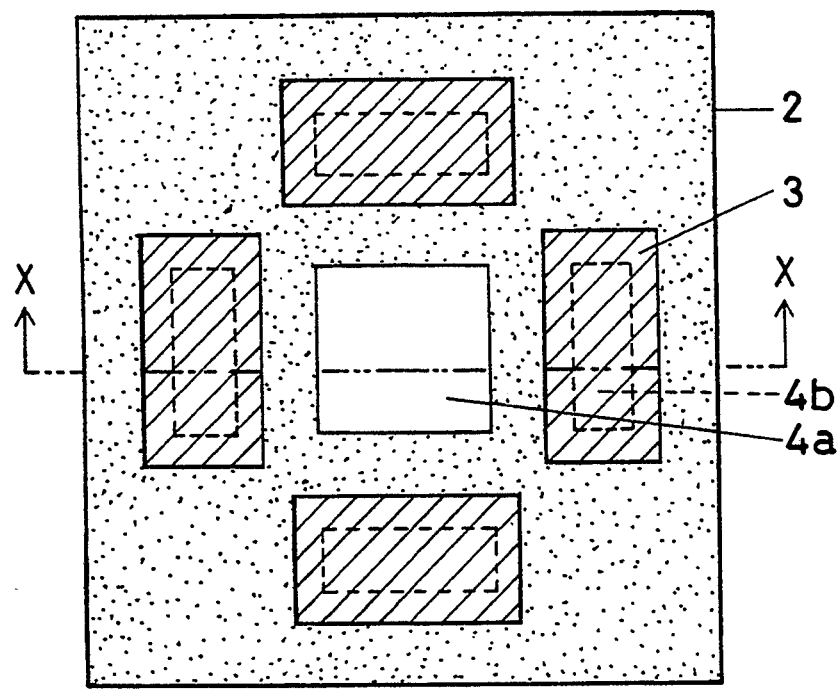
FIG. 3 is a plan view illustrating one example of a conventional phase shift photomask in which a second opening pattern adjacent to a first opening pattern is not annular.
Figure 4:
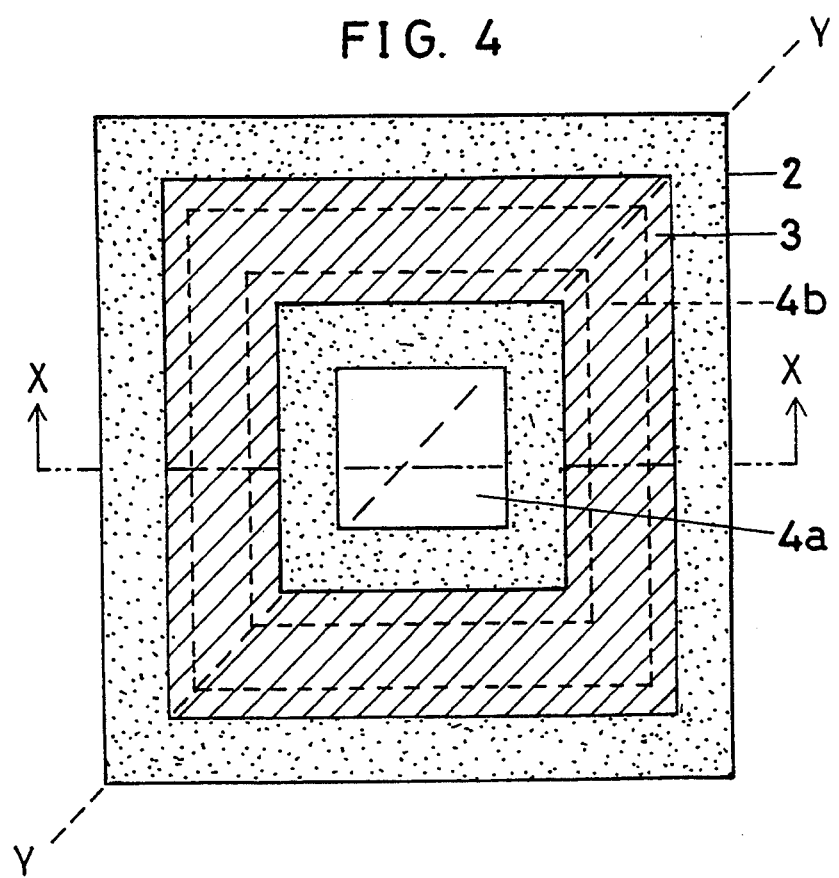
FIG. 4 is a plan view illustrating one example of a conventional phase shift photomask in which a second opening pattern adjacent to a first opening pattern is annular.

FIG. 3 is a plan view illustrating one example of a conventional phase shift photomask in which a second opening pattern 4b adjacent to a first opening pattern 4a is not annular. FIG. 4 is a plan view illustrating one example of a conventional phase shift photomask in which a second opening pattern 4b adjacent to a first opening pattern 4a is annular.

Reference numeral 1 denotes a transparent substrate, 2 a light-shielding layer, 3 a phase shifter layer, 4a a first opening pattern, and 4b a second opening pattern. In any of the three phase shift photomasks, the phase shifter layer 3 is formed so as to completely cover the second opening pattern 4b.

FIG. 5 is a graph illustrating the relationship between the depth of focus (hereinafter referred to as "D.O.F.") and the dimension variation on the wafer surface at the time of transferring a pattern to a wafer by using each of the phase shift photomasks shown in FIGS. 1, 3 and 4.

In this embodiment, a stepper having a wavelength $\lambda = 365$ nm, a lens numerical aperture $NA = 0.5$, and a partial coherence $\sigma = 0.4$ was employed.

As will be clear from the graph of FIG. 5, the conventional phase shift photomask shown in FIG. 3, in which the second opening pattern 4b is not annular, shows a tendency that the pattern dimension decreases as D.O.F. is changed to 0.4 μm, 0.8 μm and 1.2 μm at a relative light intensity where the pattern dimension on the wafer is 0.4 μm when D.O.F.=0.

On the other hand, the phase shift photomasks shown in FIGS. 1 and 4, in which the second opening pattern 4b is annular, show a tendency that the pattern dimension increases as D.O.F. is changed to 0.4 μm, 0.8 μm and 1.2 μm at a relative light intensity where the pattern dimension on the wafer is 0.4 μm when D.O.F.=0.

Incidentally, assuming that the margin (tolerance limit) for the dimensional accuracy is 10%, that is, 0.04 μm, in the phase shift photomasks shown in FIGS. 1 and 4, in which the second opening pattern 4b is annular, the error in dimension falls within the margin for the dimensional accuracy even at D.O.F.=1.2 μm. On the other hand, in the phase shift photomask shown in FIG. 3, in which the second opening pattern 4b is not annular, the error in dimension exceeds the tolerance limit at a D.O.F. of about 0.9 μm and is no longer allowed at a larger D.O.F.

Figure 6A:
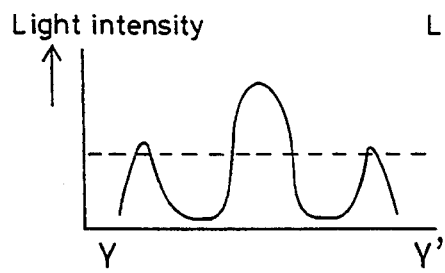
FIG. 6 graphically shows the light intensity during pattern transfer in the Y—Y section of each of the phase shift photomasks shown in FIGS. 1 and 4.
Figure 6B:
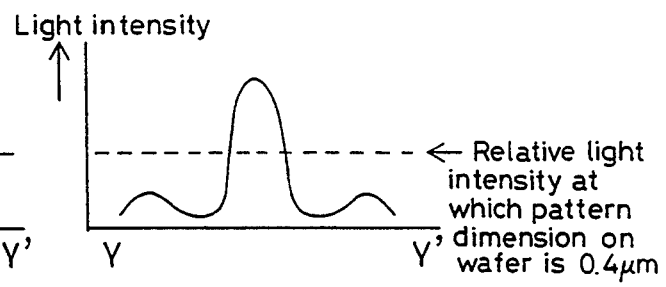

In the meantime, the phase shift photomask shown in FIG. 4 involves the problem that the light intensity is relatively high at the four corners of the annular second opening pattern 4b, so that regions corresponding to the four corners resolve at a relative light intensity where the pattern dimension on the wafer is 0.4 μm, producing an adverse effect on the transferred pattern. On the other hand, in the phase shift photomask of the present invention, shown in FIG. 1, the area of the regions that transmit light is controlled by properly patterning the light-shielding film 2c in each of the four corners, thereby preventing the four corners of the annular second opening pattern 4b from resolving and producing an adverse effect on the transferred pattern, and yet enabling the phase shift-photomask to have a depth of focus which is substantially equal to that of the conventional phase shift photomask. FIG. 6 comparatively shows the light intensity during pattern transfer in the Y—Y section of each of the phase shift photomasks shown in FIGS. 1 and 4. It will be understood from FIG. 6 that in the phase shift photomask of the present invention, shown in FIG. 1, the light intensity at the four corners of the annular second opening pattern 4b is held down satisfactorily to a low level.

Figure 7:
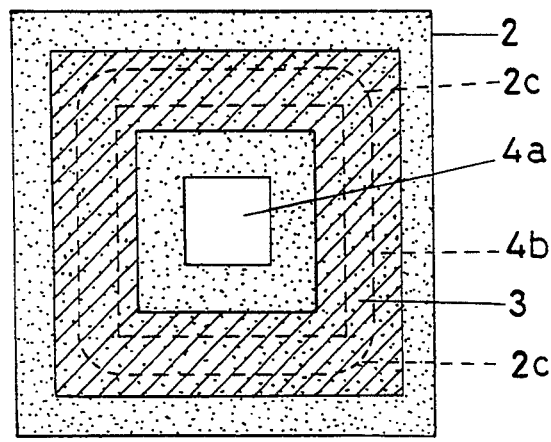
FIG. 7 is a plan view illustrating another embodiment of the phase shift photomask according to the present invention.

FIG. 7 is a plan view illustrating another embodiment of the phase shift photomask according to the present invention, in which the light-shielding film 2c is left in a curved line shape in each of the four corners of the annular second opening pattern 4b. This phase shift photomask also provides advantageous effects similar to those of the above-described phase shift photomask, shown in FIG. 1.

Thus, in the phase shift photomasks according to the described embodiments, the second opening pattern 4b, which is adjacent to the first opening pattern 4a, is annularly formed such that the light-shielding film 2c is left in each of the four corners thereof, and the phase shifter layer 3 is provided over the annular second opening pattern 4b. Accordingly, there is no possibility that the second opening patterns 4b will resolve, and it is possible to form a pattern having minimal variation in dimension even at different focus positions.

As has been described above, the phase shift photomask of the present invention enables formation of a pattern having minimal variation in dimension even at different focus positions.

What we claim is:

1. A phase shift photomask having a first opening pattern (4a) formed by partially removing a light-shielding film (2) provided on a transparent substrate (1), a second opening pattern (4b) with a very small width which is annularly provided in a peripheral region adjacent to said first opening pattern (4a) by partially removing said light-shielding film (2), and a phase shifter layer (3) provided over either of the first or second opening patterns (4a, 4b), said phase shift photomask comprising a light-shielding film (2c) left in each of four corners of said second opening pattern (4b) so as to limit light transmitted through the four corners.

2. A phase shift photomask according to claim 1, wherein said light-shielding film (2c) is left in an oblique line shape in each of the four corners of said second opening pattern (4b).

3. A phase shift photomask according to claim 1, wherein said light-shielding film (2c) is left in a curved line shape in each of the four corners of said second opening pattern (4b).

* * * * *